United States Patent [19]

Nonaka et al.

[11] 4,021,767

[45] May 3, 1977

[54] HALL ELEMENT AND METHOD OF MANUFACTURING SAME

[75] Inventors: Kohei Nonaka, Tokyo; Michio Sudo, Kuki, both of Japan

[73] Assignee: Asahi Kasei Kogyo Kabushiki Kaisha, Osaka, Japan

[22] Filed: July 11, 1975

[21] Appl. No.: 594,974

[30] Foreign Application Priority Data

June 12, 1975 Japan .............................. 50-71173

[52] U.S. Cl. ............................ 338/32 H; 29/576 R
[51] Int. Cl.² ........................................ H01L 43/04
[58] Field of Search ............... 338/32 H; 323/94 H; 324/45, 46; 310/DIG. 3; 357/27; 29/610, 576

[56] References Cited

UNITED STATES PATENTS

| | | |
|---|---|---|
| 3,265,959 | 8/1966 | Wiehl et al. ................. 338/32 H X |
| 3,373,391 | 3/1968 | Bohm et al. ..................... 338/32 H |
| 3,845,444 | 10/1974 | Masuda et al. ............. 338/32 H X |

*Primary Examiner*—C. L. Albritton
*Attorney, Agent, or Firm*—Sughrue, Rothwell, Mion, Zinn & Macpeak

[57] ABSTRACT

A cleaved surface of a crystal is used as a substrate for evaporation, and a high mobility semiconductor is evaporated to a thickness of 0.5 to 1.5 μm to form a deposited thin semiconductor film, on which a first magnetizable member having a high magnetic permeability is applied with an adhesive. Subsequently the substrate is removed, and an electrode is formed on the exposed surface of the evaporated thin film, and a second magnetizable member is applied thereon with an adhesive. Where a special humidity resistance is required, a reinforcing layer of an electrically insulating and moisture-impervious inorganic material is formed directly on the evaporated thin semiconductor film before the first magnetizable member is applied.

3 Claims, 10 Drawing Figures

HALL ELEMENT AND METHOD OF MANUFACTURING SAME

BACKGROUND OF THE INVENTION

The invention relates to a Hall element and a method of manufacturing same which utilizes an evaporated semiconductor film.

Hall elements are widely used to detect or determine the magnitude of a magnetic field by utilizing the Hall effect. A conventional Hall element comprises a single crystal of a semiconductor material having a high mobility. The Hall effect can be expressed by the following formula:

$$E \alpha\ RBI/t$$

where $E$ represents a Hall voltage developed, $R$ the Hall coefficient of the material, $B$ the applied flux density, $I$ the current applied and $t$ the thickness of the semiconductor employed. Heretofore, the trend has been to reduce $t$ or the thickness of the single crystal of semiconductor used in order to maximize the output voltage from the Hall element. However, there is a limitation on the thinness which can be achieved, and the minimum thickness is 10 $\mu$m under the present status of technology. Also difficulties are experienced in obtaining a single crystal of an increased area. When the material is cleaved to a reduced thickness, the cleaved crystal must be polished, resulting in a waste of the material. In view of these considerations, it has been proposed to form an evaporated thin film of a semiconductor having a high mobility. When a thin film is formed by evaporation, it is possible to achieve a thickness on the order of 1.5 $\mu$m. However, to provide a satisfactory film with such a thickness, the unevenness of the surface of a substrate which is used for the evaporation process must be reduced to at least below 1.5 $\mu$m. If the evaporated film is subjected to a photolithographic etching, the surface of the substrate on which the thin film is to be formed must be roughened to a suitable degree in order to avoid exfoliation of the evaporated film. Therefore, it will be appreciated that the requirement for a reduced thickness of the evaporated film and the demand on the evaporation substrate for the convenience of manufacturing and stability are conflicting. As will be understood from the above formula, the output can be increased by concentrating the magnetic flux to thereby increase the magnitude of B. This may be achieved by using a bulk element which is sandwiched between a pair of closely spaced magnetizable members. However, where the thin film is evaporated on a non-magnetic substrate, the magnetizable member can only be disposed on one surface of the film. Though it may appear that the semiconductor film can be directly evaporated on an electrically nonconductive, magnetizable member, the preparation of the magnetizable member to provide a sufficiently smooth evaporation surface is liable to cause exfoliation, resulting in difficulties during and after the manufacturing process. On the other hand, if a certain degree of unevenness of the evaporation surface is allowed, an evaporated film of sufficiently reduced thickness and having a satisfactory film quality cannot be obtained.

Considering some known Hall elements, British Pat. No. 1,015,469 describes the manufacturing of a Hall element which comprises preparing a single crystal of indium antimony to a thickness on the order of 0.01 inch (254 $\mu$m), bonding it to a ferrite slab which is smoothly polished by means of epoxy resin, reducing the indium antimony to a thin film on the order of 0.0005 to 0.001 inch (12.7 to 25.4 micronmeter) by polishing with a parallel diamond lapper, and bonding another ferrite thereon. The process described in this patent employs the polishing of a semiconductor to a thin film, which cannot be reduced to a thickness less than 10 to 30 microns which represent the limit achievable with the polishing technique. As a consequence, a Hall element having a high output cannot be manufactured. Additionally, there is a waste of material because of the use of the bulk element.

British Pat. No. 926,250 describes slicing a single crystal of indium antimony semiconductor to a thickness less than 250 micrometer or even below about 60 micronmeter, and holding it between a pair of ferrite members with epoxy resin to form a Hall element. However, a high output element cannot be obtained with a thin film of such a thickness.

British Pat. No. 1,017,033 describes alternating evaporated layers of Hall effect material such as indium antimony or the like with layers of ferromagnetic material, which is sprayed, coated or applied on a plastic film for the purpose of information recording and retrival. This patent discloses that the thickness of the ferromagnetic layer is from 0.02 to 1 microninches and that the Hall effect layers comprising indium antimony having the same thickness. Such thickness is from 5.1 Angstrom (0.00051 micronmeter) to 255 Angstrom (0.0255 micronmeter). When the thickness is extremely reduced below 0.5 millimicron, the surface effect degrades the characteristic, preventing a high output from being produced. In an experiment conducted by the inventors, it is found that the evaporation of a thin semiconductor film directly on a ferromagnetic material cannot achieve a satisfactory output. This is considered to be due to the failure of the ferromagnetic material to provide sufficiently smooth surface. U.S. Pat. No. 3,082,124 discloses operating parameters such as temperature, pressure or the like which are employed during an evaporation process of a thin film of indium antimony semiconductor onto a glass plate or ceramic plate. However, this patent does not teach useful configuration of holding it between ferrite members. A satisfactory flux concentration cannot occur when the thin film is held between magnetizable members with an evaporating substrate interposed therebetween.

German Pat. No. 1,098,581 describes a semiconductor element having reluctance effect, which is encapsulated in an insulating material together with leads attached thereto, which is in turn secured between a pair of ferrite members. While not specifically described, it is undoubtedly clear from the illustration and the technical level in 1955 when that invention was made that the element comprises a single crystal which cannot have a thickness less than 10 micronmeter.

From the foregoing discussions, it will be appreciated that a considerable amount of effort has been directed to obtaining a thin film of semiconductor having a high mobility, but failed to produce a thin film of satisfactory quality and having a thickness on the order of 0.5 $\mu$m to 1.5 $\mu$m. As a result, with the prior art Hall elements, the activating current must be increased to result in an increased current dissipation. In addition, the signal-to-noise ratio is low, preventing their use to the detection of a very weak magnetic field.

It is an object of the invention to provide a Hall element using an evaporated film of a semiconductor having a high mobility and which is of a sufficiently reduced thickness and has a sufficiently large flux concentration effect to produce a high output.

It is another object of the invention to provide a Hall element which produces a high output and provides a good stability and a long useful life.

It is a further object of the invention to provide a Hall element capable of producing a high output and which exhibits a good resistance to even a high humidity environment.

It is an additional object of the invention to provide a method of manufacturing a Hall element which minimzes the quantity of the material used and which permits a high output Hall element to be produced inexpensively.

It is still another object of the invention to provide a practicable method of manufacturing a Hall element which produces a thin film of a high mobility semiconductor of a reduced thickness and having an improved crystal structure.

SUMMARY OF THE INVENTION

Figure 1:
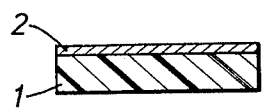
FIG. 1 is a schematic cross section showing a lamination of an evaporated semiconductor film on a substrate.

In accordance with the invention, input electrodes and output electrodes are formed on one surface of an evaporated thin film of a high mobility semiconductor which has a thickness from 0.5 to 1.5 $\mu$m. A first and a second magnetizable member are applied to the opposite surfaces of the evaporated film with an adhesive. The use of an evaporated thin film permits a thickness below 1.5 $\mu$m to be achieved, thereby enabling an increased output while avoiding the influence of the surface effect, by choosing the thickness to be not less than 0.5 $\mu$m. Since the first and the second magnetizable members are applied to the opposite surfaces of the film through a very thin layer of adhesive, an excellent flux concentration effect is achieved, further contributing to increasing the magnitude of the output.

To produce a thin film of high quality, a smooth cleaved surface of a crystal is used as an evaporation substrate, which minimizes the unevenness and assures a satisfactory film quality even with a thickness of 0.5 to 1.5 $\mu$m. By choosing a temperature for the evaporation substrate which is as high as possible, preferably approaching the melting point of the semiconductor used, there is produced an evaporated film which is very near to a single crystal, thus obtaining a mobility which approximates that of the single crystal to improve the film properties. After an excellent thin film of semiconductor is evaporated on the cleaved surface of the crystal and the first magnetizable member is applied thereon with an adhesive, the evaporation substrate is removed from the assembly, thus transferring the evaporated thin film onto the first magnetizable member. A second magnetizable member is applied to the exposed surface of the evaporated thin film which is thus freed from the substrate, thereby permitting the evaporated film to be held between the first and the second magnetizable members with a very small spacing therebetween. Where the evaporation substrate is removed by exfoliation, it can be separated without damage to the evaporated film by virtue of the fact that the substrate is a cleaved surface and hence is smooth. The evaporated film is subjected to a photolithographic processing while the first magnetizable member is applied thereto. Such processing is facilitated because of the strong adhesion therebetween and takes place without causing damage to the thin film. Since the first and the second magnetizable members are adhered to the evaporated thin film with a layer of adhesive interposed therebetween, these magnetizable members may be electrically conductive.

As compared with the thickness of the evaporated film which ranges from 0.5 to 1.5 $\mu$m, the layer of adhesive which is used in applying the first magnetizable member to the thin film has a substantially increased thickness on the order of 50 $\mu$m in order to provide satisfactory bonding strength. If an adhesive having humidity resistance is used, it is still influenced by the humidity though to a reduced degree. Where the Hall element is used in a relatively high humidity environment, the adhesive is influenced by the humidity to change its thickness, which though slightly, may cause an unevenness of the semiconductor thin film applied thereto, thus substantially degrading the film properties. If foam is contained in the adhesive used, perforations may be produced in the evaporated thin film where the foam lies. In these considerations, a reinforcing layer of an electrically insulating, moisture-impervious and relatively hard inorganic material is formed in direct contact with that surface of the evaporated thin film which is opposite from the surface on which the input and output electrodes are formed, particularly when the element is used in an adverse humidity environment. In this manner, a humidity resistant element is obtained, and the increased strength of the evaporated film facilitates its manufacturing. Similarly, a protective layer of an electrically insulating, moisture-impervious inorganic material may be formed in direct contact with the surface of the evaporated thin film on which the electrodes are formed in order to improve the manufacturing convenience and humidity resistance.

DETAILED DESCRIPTION OF PREFERRED EMBODIMENTS

Referring to FIG. 1, there is provided a substrate 1 for evaporation. The evaporation substrate 1 represents a crystal having a smooth cleaved surface, which is used for evaporation thereon. The crystal may be mica, sodium chloride, potassium bromide, for example, and preferably has a crystal structure and a lattice constant which are approaching those of a semiconductor to be evaporated thereon. Where the semiconductor to be evaporated is indium antimony, a sheet of mica may be used. For germanium, single crystals of sodium chloride, potassium bromide, or barium chloride may be used. A semiconductor having a high mobility is deposited in vacuum on the substrate 1 to form a thin evaporated film 2 of semiconductor. A suitable semiconductor for such evaporation includes intermetallic compound such as indium antimony, indium arsenic or the like. Preferably the evaporated film 2 has a thickness from 0.5 to 1.5 $\mu$m, and most preferably a thickness around 1.0 $\mu$m. Below 0.5 $\mu$m, the surface effect reduces the mobility, thereby reducing the output. Above 1.5 $\mu$m, a desired output level cannot be reached. During evaporation, it is desirable to maintain the temperature of the substrate 1 as high as possible so as to bring it close to the melting temperature of the semiconductor used. In particular, when a mica is used for the substrate, it is possible to obtain a very thin sheet of mica which is separated along the cleavage surfaces of the crystal, thereby permitting the substrate to be heated uniformly to a relatively high temperature.

Figure 2:
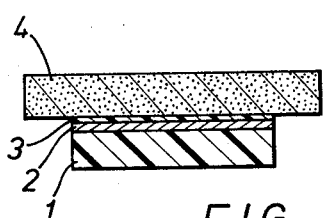
FIG. 2 is a schematic cross section showing a first magnetizable member applied on top of the evaporated film shown in FIG. 1.

As shown in FIG. 2, a first magnetizable member 4 having a high magnetic permeability, such as soft ferrite, permalloy, silicon steel or the like, is bonded on the evaporated film 2 with a layer of an adhesive 3. The surface of the first magnetizable member 4 which faces the film 2 has a larger area than that of the film, and should be relatively smooth having an unevenness less than 1 micronmeter, for example. A ferrite sheet which is normally used for evaporation can be lapped with No. 1200 grits to a smoothness in which the maximum unevenness is less than 0.4 micronmeter. Alternatively, a sheet having greater surface unevenness, having a maximum unevenness of 20 micronmeters, which can be obtained by a simple lapping with No. 400 grits after cleaving the sheet, can be used.

A suitable adhesive comprises unsaturated polyester, epoxy, phenol, cyanoacrylate. Preferably, an adhesive is used which does not undergo swelling or whitening after a prolonged period of immersion in water subsequent to the hardening.

Normally, a two-liquid reacting epoxy adhesive having an improved humidity resistance is used, which preferably incorporates a hardener such as phthalic anhydride. The adhesive 3 has a layer thickness which preferably is as low as possible, but which is usually on the order of 10 to 100 $\mu$m for practical reasons.

Figure 3:
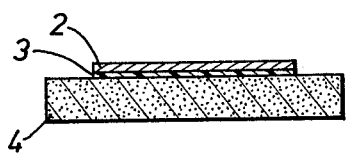
FIG. 3 is a schematic cross section of the lamination shown in FIG. 2 from which the substrate is removed, with the lamination being shown in inverted position.

Subsequently, the evaporation substrate 1 is removed from the assembly, as shown in FIG. 3. Where the substrate 1 comprises mica, it can be stripped off. A substrate formed of sodium chloride or potassium bromide can be removed by dissolution in water. The use of mica for the substrate is preferred not only because of the smoothness provided by the cleaved surface, but because of its reduced bonding strength with the evaporated film 2, which facilitates its later removal. After removal of the substrate 1, the exposed surface of the evaporated film 2 will be a mirror surface which has the same degree of smoothness as the substrate 1.

Figure 4:
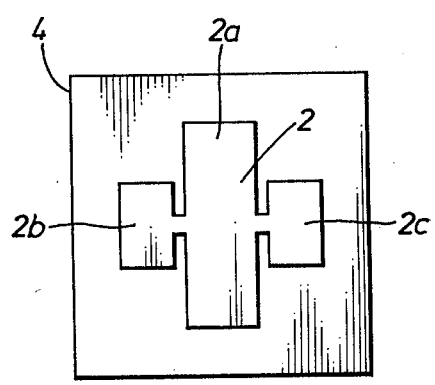
FIG. 4 is a plan view of the evaporated film of FIG. 3 defined to a given configuration.
Figure 5:
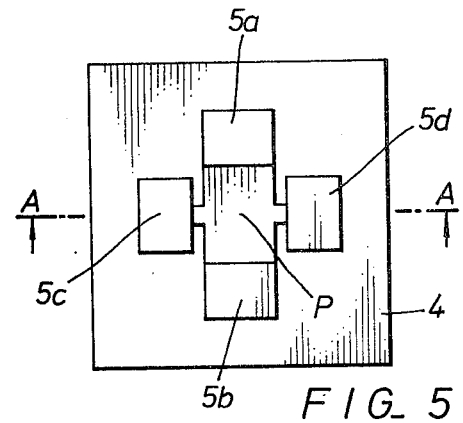
FIG. 5 is a plan view showing electrodes formed on the evaporated film of FIG. 4.
Figure 6:
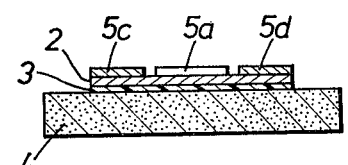
FIG. 6 is a schematic cross section taken along the line A—A shown in FIG. 5.

As shown in FIG. 4, the evaporated film 2 carried on the first magnetizable member 4 is photoetched to a desired configuration, thus forming a pair of electrode portions 2b and 2c on the opposite sides of a current path 2a intermediate its ends. The electrode portions 2b, 2c are connected with the current path 2a through portions of reduced width. Copper, gold or silver is deposited on the opposite ends of the current path 2a and on the electrode portions 2b, 2c as by electroplating, evaporation, sputtering or the like, thus forming electrodes 5a to 5d as shown in FIGS. 5 and 6. The portion of the current path 2a located intermediate the electrodes 5c and 5d forms a sensitive area P.

Figure 7:
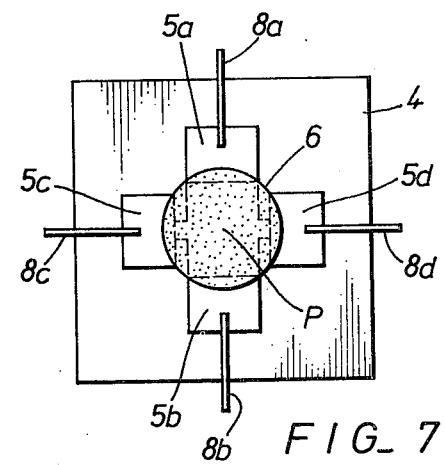
FIG. 7 is a top view of the lamination shown in FIGS. 5 and 6 to which a second magnetizable member and lead wires are attached.
Figure 8:
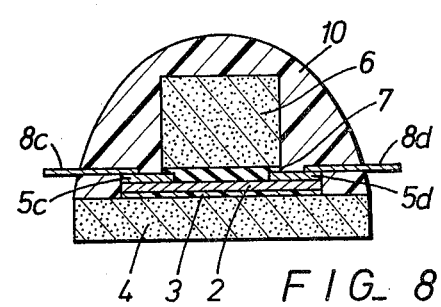
FIG. 8 is a schematic cross section of the Hall element according to the invention, as shown in FIG. 7, which is encapsulated in a protective resin.

Subsequently, as shown in FIGS. 7 and 8, a second magnetizable member 6 is adhesively secured to the evaporated film 2 by overlaying it on a part or all of the film 2 and a portion of the electrodes 5a to 5d as required, and by bonding it with a layer of an adhesive 7. The arrangement shown in FIG. 7 in which the second magnetizable member 6 overlies the electrodes 5c, 5d and thus protect the interconnecting portions of reduced width between the electrodes 5c, 5d and the current path 2a is advantageous for mass production, preventing contamination or damage of the evaporated film 2 when a number of Hall elements are formed on a common magnetizable member 4 and subsequently subdivided into individual elements. The second magnetizable member 6 may comprise the same material as used for the first magnetizable member 4, and preferably has an increased height in a direction perpendicular to the plane of the evaporated film 2 for enhancing the flux concentration effect.

Figure 9:
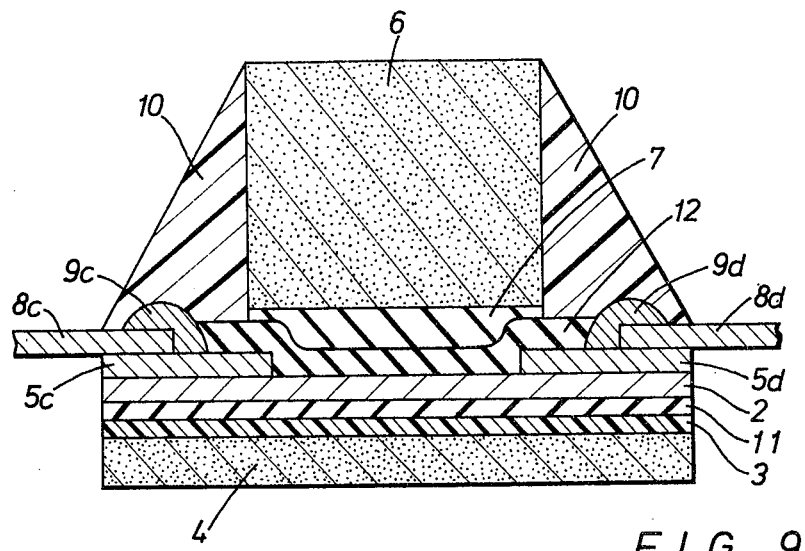
FIG. 9 is a schematic cross section of another embodiment of the Hall element according to the invention.
Figure 10:
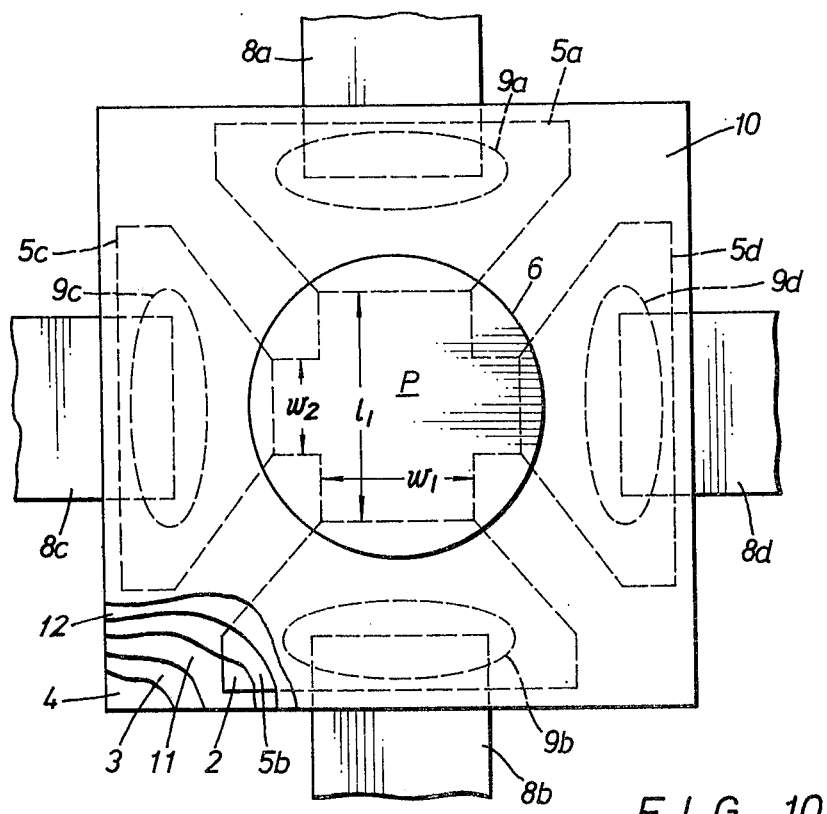
FIG. 10 is a top view, partly cut away, of the Hall element shown in FIG. 9.

Lead wires 8a to 8d are soldered to the electrodes 5a to 5d, respectively. The material of the lead wires is not specifically limited, and usually comprises Kovar wire (an alloy of iron, nickel and cobalt). The Hall element thus constructed is encapsulated, in its portion toward the second magnetizable member 6, in a protective resin 10 as shown in FIG. 8. The resin 10 may be similar to the material of the adhesives 3, 7.

Where a high resistance to environment is required, a reinforcing layer 11 of an electrically insulating and moisture-impervious inorganic material is directly formed on the evaporated film 2 as shown in FIGS. 9 and 10. The reinforcing layer 11 may comprise silicon dioxide, silicon monooxide or silicon oxide added with lead to form a vitreous composition, and may be similar to those protective layers which are currently used in the semiconductor art in the manufacturing of transistors and integrated circuits. To provide a satisfactory insulating film property, the reinforcing layer 11 must have a minimum thickness of 0.3 $\mu$m, and should preferably have a thickness of 0.5 $\mu$m or greater for enhanced humidity resistance. The reinforcing layer 11 is deposited, as by vacuum evaporation, ion plating, sputtering or similar processes, on the evaporated film 2 which is formed as shown in FIG. 1, and the first magnetizable member 4 is applied on the reinforcing layer 11. The subsequent procedure is similar to that described previously.

As shown in FIG. 9, another protective layer 12 of an electrically insulating and non-magnetic inorganic material is directly formed on the surface of the evaporated film 2 which is located opposite the second magnetizable member 6. To form the protective layer 12, subsequent to the formation of the electrodes 5a to 5d, solders 9a to 9d are applied to predetermined positions where lead wires 8a to 8b are to be connected, as shown in FIG. 9, and then the inorganic material which forms the protective layer 12 is deposited, as by sputtering, ion plating, vacuum evaporation or similar process, onto a portion of the evaporated film 2, namely, the sensitive area P, and more preferably on the entire surface thereof including the electrodes 5a to 5d and the solders 9a to 9d. The second magnetizable member 6 is formed on the protection layer 12, with a layer of adhesive 7 interposed therebetween. The subsequent procedure is similar to that described previously. When connecting the lead wires 8a to 8d with the electrodes 5a to 5d, the lead wires can be disposed on the protective layer 12 at positions which correspond to the location of the solder of the associated electrodes, and a soldering iron can be brought into contact with the protective layer from above to destroy it, thereby allowing the lead wires to be easily connected with the associated electrode by solder which is located therebelow. By connecting the lead wires 8a to 8d with the electrodes 5a to 5d before the second magnetizable member 6 is adhesively secured, the possibility of damaging the evaporated film 2 by the protective layer 12 during its securing operation can be minimized. The material for the protective layer 12 may be similar to that of the reinforcing layer 11.

The invention will be further illustrated by way of Examples, which are illustrative only and are not intended as limiting the scope of the invention.

EXAMPLE 1

A fragment of single crystal indium antimony having a purity of 99.99999% was evaporated onto a sheet of mica, maintained at a temperature of about 480° C, in a vacuum of $2.7 \times 10^{-6}$ mmHg, the sheet of mica having a thickness of 65 micronmeters and a diameter of about 60 mm. With an evaporation period of 100 minutes, an evaporated film of indium antimony having a thickness of about 0.8 micronmeter was obtained.

A two-liquid reacting epoxy adhesive containing phthalic anhydride as hardener was vacuum defoamed and applied to a thickness of 50 micronmeters, thereby forming a first adhesive layer. As a first magnetizable member, a sheet of soft ferrite having a high magnetic permeability, formed as a square measuring 30 mm on a side, was pressed against the first adhesive layer with the pressure of nearly 200 g/cm², and heated to a temperature of about 60° C for 5 hours while maintaining it in a horizontal position. Subsequently, a heating to 100° C was continued for 2 hours to harden the adhesive. Then, the sheet of mica was gently removed by separation, and a transparent cellulose tape coated with a pressure-sensitive rubber adhesive is applied against the exposed surface of the evaporated film and stripped off, thereby removing traces of mica which remained on the evaporated film, by adhesion with the tape.

By photoetching process, the current path 2a and the electrode portions 2b, 2c are formed in the semiconductor film, and the electrodes 5a to 5d were formed by an electroless plating of copper. The width $W_1$ of the sensitive area P was 0.4 mm, the spacing $l_1$ between the electrodes 5a, 5b, 0.80 mm, and the width $W_2$ of the narrow interconnecting portions between the current path 2a and the electrodes 5c, 5d, 0.20 mm (see FIG. 10). A number of such element patterns were simultaneously formed. To provide corrosion resistance and to facilitate the application of solder, each of the electrodes 5a to 5d was covered with a layer of silver which was applied by an electroless plating. The entire upper surface including the sensitive area and the electrodes was coated with a photosensitive resin, specifically KTFR manufactured by Kodak Company, and exposed to light while placing masks adjacent to the position of the solders 9a to 9d above the respective electrodes. The unhardened resin which was located below the respective masks was eliminated, and the assembly immersed into a vessel which contained molten solder to provide a solder plating on the silver electrodes. After removal from the vessel, the remaining exposed and hardened resin film was removed.

As a second magnetizable member, soft ferrite in a solid cylindrical form measuring 1.2 mm high and 1.2 mm in diameter was bonded to the sensitive area by using the same adhesive as the first adhesive layer, and the adhesive hardened under the same conditions as that used with the first magnetizable member.

The individual Hall elements were separated by using a diamond cutter, and Kovar wires having a rectangular section which is 0.1 mm high and 0.3 mm wide were soldered to the respective electrodes of each element. Each Hall element was then encapsulated in a protective resin 10 which comprises the same adhesive as that used in the formation of the first and second adhesive layers, which adhesive was subjected to a thermal hardening treatment of 60° C for 5 hours followed by 100° C for 2 hours, thus obtaining 10 Hall elements.

The effective output or Hall voltage of these Hall elements in a flux density of 1 kilogauss was determined to be 372 millivolts when a rated current input of 5 milliamperes was applied.

EXAMPLE 2

A 0.8 μm thick film of indium antimony was evaporated onto the same sheet of mica under the same conditions as in Example 1. A reinforcing layer was formed on the evaporated semiconductor film by vacuum evaporation of silicon monooxide having a purity greater than 99.9% in a vacuum of $3 \times 10^{-4}$ mmHg. The alumina boat which contained the silicon monoxide was maintained at a temperature of 1200° C, and the evaporation continued for 7 minutes, which resulted in a thickness of 0.4 micronmeter for the reinforcing layer. An interference fringe inherent to a thin film was observed, and when the reinforcing layer was gently rubbed with a finger, no damage occurred in the reinforcing layer which was visible to the naked eye.

Using the same adhesive as in Example 1, a sheet of soft ferrite having a high magnetic permeability and of same size as before was bonded to the reinforcing layer according to the technique outlined in Example 1. The thickness of the first adhesive layer was 40 micronmeters. Subsequently, ten Hall elements were produced using the same materials and parameters generally in accordance with the procedure described in Example 1. Under the same testing conditions, these Hall elements produced a Hall voltage of 370 mV.

EXAMPLE 3

In the procedure of Example 2, a protecting layer comprising silicon monoxide was formed on the evaporated semiconductor film, using the same parameters as those of the reinforcing layer, before the second magnetizable member was mounted. Subsequently, the procedure described in Example 2 was followed to produce Hall elements, which were determined on the same testing conditions as in Example 1 to produce 367 mV.

The Hall elements obtained in Examples 1 to 3 were subjected to repeatedly cycles of moistening and drying, each cycle comprising maintaining the Hall elements in an environment of 65° C and relative humidity of 97% for about 12 hours followed by maintaining them at a temperature of 25° C and a relative humidity of 65% for about 12 hours. After the completion of each cycle, the elements have been examined with a microscope, and the output was measured after 10 cycles. It is then found that the Hall elements produced in accordance with Example 1 showed surface deformation after three cycles to disable the determination of the output, while the Hall elements produced in accordance with Examples 2 and 3 remained without change in their condition and also in their output.

From the foregoing, it will be appreciated that the invention permits a thin semiconductor film to be evaporated and held between a pair of closely spaced magnetizable members to increase the flux concentration effect. In the above Examples, the elements produced a Hall voltage on the order of 370 mV. By contrast, the commercially available Hall elements have a Hall voltage which is on the order of 60 to 80 mV under the same condition, which demonstrates the excellent quality of the Hall element manufactured in accordance with the invention. The high output permits a detection of a very weak magnetic field. Alternatively, the input current can be reduced to obtain the same output level, thus reducing the current dissipation. The provision of the reinforcing layer permits its use in a high humidity environment. The close attachment of the magnetizable members to the opposite surfaces of the evaporated film is made possible by the evaporation of the film on the cleaved surface of the crystal and its transfer to one of the magnetizable members, which takes place without causing damage to the evaporated film.

Having described the invention, what is claimed is:

1. A Hall element comprising:
    an evaporated thin film of a semiconductor having a high mobility and having a thickness of 0.5 to $1.5\mu$, separated from an evaporation substrate after evaporation;
    input electrodes and output electrodes formed on one surface of the evaporated thin film;
    a first magnetizable member bonded to said one surface of the evaporated thin film by a layer of adhesive disposed between said first member and said one surface; and
    a second magnetizable member bonded to the other surface of the evaporated thin film by a layer of adhesive disposed between said second member and said other surface.

2. A Hall element according to claim 1, further including a reinforcing layer of an electrically insulating and moisture-impervious inorganic material which is formed in direct contact with said other surface of the evaporated thin film.

3. A Hall element according to claim 2, further including a protective layer of electrically insulating and moisture-impervious inorganic material which is formed in direct contact with said one surface of the evaporated thin film.

* * * * *